United States Patent [19]

Scherer

[11] Patent Number: 5,716,505
[45] Date of Patent: Feb. 10, 1998

[54] APPARATUS FOR COATING SUBSTRATES BY CATHODE SPUTTERING WITH A HOLLOW TARGET

[75] Inventor: Michael Scherer, Rodenbach, Germany

[73] Assignee: Balzers Prozess-Systems GmbH, Hanau, Germany

[21] Appl. No.: 802,228

[22] Filed: Feb. 19, 1997

[30] Foreign Application Priority Data

Feb. 23, 1996 [DE] Germany .................. 196 06 714.6
Mar. 9, 1996 [DE] Germany .................. 196 09 248.5

[51] Int. Cl.$^6$ .................................................. C23C 14/34
[52] U.S. Cl. .................... 204/298.11; 204/298.09; 204/298.15; 204/298.16; 204/298.21; 204/298.28
[58] Field of Search ................ 204/298.11, 298.09, 204/298.12, 298.15, 298.23, 298.28, 192.12, 298.21

[56] References Cited

U.S. PATENT DOCUMENTS

| | | | |
|---|---|---|---|
| 4,933,064 | 6/1990 | Geisler et al. | 204/298 |
| 5,069,770 | 12/1991 | Glocker | 204/298.21 X |
| 5,417,834 | 5/1995 | Latz | 204/298.11 |
| 5,423,971 | 6/1995 | Arnold et al. | 204/298.11 |
| 5,482,611 | 1/1996 | Helmer et al. | 204/298 |

FOREIGN PATENT DOCUMENTS

| | | |
|---|---|---|
| 0254168 | 1/1988 | European Pat. Off. |
| 0297779 | 1/1988 | European Pat. Off. |
| 0558797 | 9/1993 | European Pat. Off. |
| 0676791 | 9/1994 | European Pat. Off. |
| 292124 | 10/1983 | Germany |
| 3541621 | 5/1987 | Germany |
| 3706698 | 1/1988 | Germany |
| 3835153 | 10/1988 | Germany |
| 4127262 | 8/1991 | Germany |
| 4211798 | 4/1992 | Germany |
| 4336830 | 10/1993 | Germany |

OTHER PUBLICATIONS

Hieber, K. "Radio–Frequency Sputter Deposition of Alloy Films."–Siemens Forsch. – u. Entwickl.–Ber., Bd. 11, 1982, Nr. 3, S. 145–148.

Horwitz, C. "Rf sputtering–voltage division between two–electrodes", J. Vac. Sci. Technol. A, 1(1), Jan.–Mar. 1983, S.60–68.

*Primary Examiner*—Nam Nguyen
*Attorney, Agent, or Firm*—Felfe & Lynch

[57] ABSTRACT

A pot-shaped hollow target (4) open toward the substrate (3) to be coated is surrounded by a dark-space shield (7) adjacent the lateral wall (5) of the target (4), and a cathode base body (11) is supported on an insulator (9) on the roof (10) of the vacuum chamber (2) and connected electrically to a power source (6). A hanger (15) reaches through a central opening (12) in the cathode base body (11) and through a central opening in the top (8) of the target (4) and is supported on the cathode base by an insulator (14), and holds a disk (16) shielding the top (8) of the target (4). A motor-driven turntable (18) forms the substrate holder (17), whose axis of rotation (19) is parallel to but offset laterally from the plane of symmetry (20) of the target by an amount (A).

5 Claims, 1 Drawing Sheet

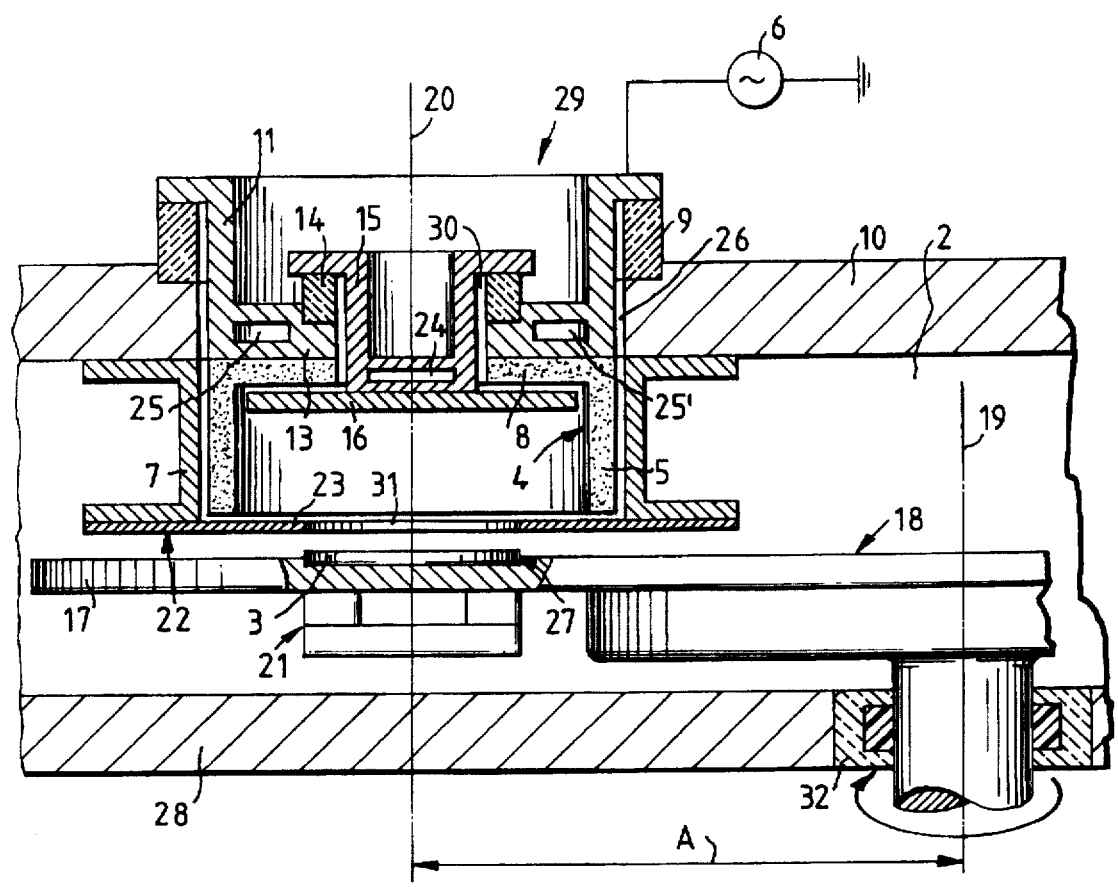

APPARATUS FOR COATING SUBSTRATES BY CATHODE SPUTTERING WITH A HOLLOW TARGET

BACKGROUND OF THE INVENTION

The invention relates to an apparatus for coating substrates by cathode sputtering with a hollow target with an opening aimed at the substrate.

A system is known for coating substrates by cathode sputtering (DE 35 06 227 C2) having a cathode plus an anode in the form of a hollow body with an opening facing the substrate, and an anode. A magnet system is provided on the outside of the hollow cathode body facing away from the substrate for the purpose of confining the sputtering zone to the inside of the cathode, and the magnet system is configured such that during operation two sputtering zones form on the inside of the cathode being sputtered, and the ratio of the sputtering powers of the two sputtering zones is variable. The hollow body of the cathode is in the form of a hollow cylinder open at one end, and a first sputtering zone is limited substantially to the inside cylindrical surface and a second sputtering zone is limited to the closed end of the cylinder.

The known arrangement has the advantage of improved step coverage combined with undiminished uniformity of coating thickness.

Also known is a coating apparatus (EP 0 459 413 A2) in which the substrate is disposed on a turntable and moves during the coating process between two targets, both of which are connected to an RF source and, separated from one another by a mask, they are held lying flat on the turntable. The known coating apparatus serves primarily for the production of magnetic recording layers consisting of a sandwich whose layers are formed by cobalt layers alternating with platinum or palladium layers.

SUMMARY OF THE INVENTION

The sputtering source according to the invention is of comparatively simple construction and therefore economical to manufacture, will permit low-energy deposition with a minimum of flaws and radiation damage and is free of any inert gas inclusion. The coatings can be deposited as MR/GMR coatings (magneto-resistive/gigant magneto-resistive) and are suitable especially for thin-film heads.

A dark-space shield surrounds the lateral wall of the target, and a cathode base is fastened to the top of the target, supported on an insulator on the roof of the vacuum chamber and connected electrically to a power source. A hanger reaches through a central opening in the cathode base and through a central opening in the top of the target and is supported on the cathode base by an insulator, and holds a disk shielding the top of the target. A motor-driven turntable whose axis of rotation is parallel to but offset laterally from the axis of rotation of the target supports the substrates to be coated.

BRIEF DESCRIPTION OF THE DRAWING

The sole FIGURE is a diagrammatic cross section of the coating apparatus.

DETAILED DESCRIPTION OF THE PREFERRED EMBODIMENT

The coating apparatus consists essentially of the cathode 11 disposed in an opening 26 in the roof 10 of the vacuum chamber and supported on an insulating ring 9, a cathode base 13 being in turn affixed to the top 8 of the target 4, a dark-space shield 7 in the form of a flanged ring around the cylindrical wall 5 of the target 4 with its bottom flange attached to a circular diaphragm 22, a hanger 15 reaching through a central opening 30 in the bottom part 13 of the cathode base and having a masking disk 16, a turntable 18 for mounting the substrates 3 which rotates in the vacuum chamber floor 28, and a magnet array 21 held on the bottom of the turntable 18.

The turntable 18 has depressions 27 on the outer area of its top surface, into which the individual substrates 3 are laid. The depressions 27 are each at a distance A from the axis of rotation 19 of the turntable which is journaled in the floor 19; the distance A corresponding also to the lateral offset of the axis of rotation 20 of the cathode 29 and target 4 and of the hanger 15 with masking disk 16.

The cathode body 11 affixed to the target 4 is connected to an a.c. power source 6 and contains channels 25 which are connected to a source of cooling water. Also, the hanger 15 inserted in the central opening 30 of the cathode 11 and resting on an insulator 14 has cooling channels 24 which serve to remove heat from the mask 16. Underneath the central opening of the circular diaphragm 22 and below the turntable 18 a stationary magnet array 21 is fastened to turntable 18.

After the vacuum chamber 2 has been pumped out and the process gas has been admitted the turntable 18 is set in rotation, so that the individual substrates 3 move one by one together with the magnet array underneath the diaphragm, while they become coated with the particles of material knocked out of the target. The individual parameters, such as the rotational speed of the turntable 18 and the electrical power applied to the cathode 29, are selected such that a uniform and homogeneous coating is deposited on the substrates 3.

I claim:

1. Apparatus for coating substrates by cathode sputtering, said apparatus comprising
   a vacuum chamber having a roof,
   a cathode base body supported on the roof of the vacuum chamber by an insulator,
   a hollow target having a top part fixed to said cathode base, said target having a lateral wall with a plane of symmetry and a downward facing opening,
   a dark spaced shield surrounding said lateral wall,
   a mask located inside said target and shielding said top part, said mask being supported by a hanger extending through a hole in said top part, and
   a turntable journaled for rotation about an axis parallel to said plane of symmetry, said turntable carrying substrates to be coated through a position below said downward facing opening.

2. Apparatus as in claim 1 further comprising a magnet array fixed to said turntable oppositely from said position below said downward facing opening.

3. Apparatus as in claim 1 further comprising a diaphragm fixed to said dark spaced shield and extending radially inward beyond the lateral wall of the target.

4. Apparatus as in claim 1 further comprising coolant passages in at least one of said hanger and said cathode base body.

5. Apparatus as in claim 1 wherein said turntable is journaled in said vacuum chamber by an insulating bushing, whereby said turntable can be charged as an anode independently of said vacuum chamber.

* * * * *